US006368899B1

(12) United States Patent
Featherby et al.

(10) Patent No.: US 6,368,899 B1
(45) Date of Patent: Apr. 9, 2002

(54) ELECTRONIC DEVICE PACKAGING

(75) Inventors: Michael Featherby; Jennifer L. DeHaven, both of San Diego, CA (US)

(73) Assignee: Maxwell Electronic Components Group, Inc., San Diego, CA (US)

( * ) Notice: Subject to any disclaimer, the term of this patent is extended or adjusted under 35 U.S.C. 154(b) by 0 days.

(21) Appl. No.: 09/520,928

(22) Filed: Mar. 8, 2000

(51) Int. Cl.[7] .......................... H01L 21/44; H01L 21/48; H01L 21/50

(52) U.S. Cl. ....................................... 438/127; 438/124

(58) Field of Search ................................ 438/122, 124, 438/125, 126, 127, 763; 257/666, 687, 789, 790, 795, 691, 704, 796

(56) References Cited

U.S. PATENT DOCUMENTS

| | | | |
|---|---|---|---|
| 3,646,409 A | * 2/1972 | Van de Water et al. | 317/234 R |
| 3,706,840 A | 12/1972 | Moyle et al. | 174/52 PE |
| 3,771,025 A | 11/1973 | Berner | 317/234 R |
| 3,828,425 A | 8/1974 | Manus | 29/590 |
| 3,914,858 A | 10/1975 | Sonoda et al. | 29/588 |
| 4,089,575 A | 5/1978 | Grabbe | 339/17 |
| 4,091,407 A | 5/1978 | Williams et al. | 357/54 |
| 4,100,675 A | 7/1978 | Landsittel | 29/627 |

(List continued on next page.)

FOREIGN PATENT DOCUMENTS

| | | | |
|---|---|---|---|
| EP | 0160327 | 11/1985 | 250/515.1 |
| FR | 2584863 | 1/1987 | |
| JP | 54004781 | 7/1980 | |
| JP | 56103452 | 8/1981 | 257/660 |
| JP | 57095650 | 6/1982 | |
| JP | 60106150 | 6/1985 | |
| JP | 60124834 | 7/1985 | |
| JP | 60180150 | 9/1985 | 257/660 |
| JP | 61004249 | 1/1986 | 257/659 |
| JP | 61004250 | 1/1986 | |
| JP | 62125651 | 6/1987 | 257/660 |
| JP | 2237053 | 9/1990 | 257/659 |
| JP | 2278740 | 11/1990 | |
| JP | 4094560 | 3/1992 | 257/660 |
| JP | 4273200 | 9/1992 | |

OTHER PUBLICATIONS

"Electronics Packaging and Production", p 26–27.
"Electronic materials and Processes, Consulting and Short Courses", p 1–3.
"Electronic Materials Handbook", p 470–483.
"Electronic Packaging and Interconnection Handbook", p6.41–6.49.
M.P. Baze et al., "Latch–Up Paths in Bipolar Integrated Circuits", IEEE Transactions on Nuclear Science, Dec. 1986, vol. NS–33. No. 6.
A. H. Johnston, et al., "The Effect of Temperature on Single–Particle Latch–Up", IEEE Transactions on Nuclear Science, Dec. 1991, vol. 38, No. 6.
Song et al., "Parametric Investigation of Latch–Up Sensitivity in 1.25 $\mu$m CMOS Technology", IEEE Transactions on Nuclear Science, Dec. 1987, vol. NS–34 No. 6.

Primary Examiner—David Nelms
Assistant Examiner—Phuc T. Dang
(74) Attorney, Agent, or Firm—Fitch, Even, Tabin & Flannery

(57) ABSTRACT

A hermetically coated device includes an integrated semiconductor circuit die, a first layer comprising an inorganic material, the first layer enveloping the integrated semiconductor circuit die, a second layer, the second layer enveloping the integrated semiconductor circuit die. Formation of such device includes steps of providing an integrated semiconductor circuit die, applying a first layer comprising an inorganic material, the first layer enveloping the integrated semiconductor circuit die, and applying a second layer, the second layer enveloping the integrated semiconductor circuit die.

16 Claims, 12 Drawing Sheets

U.S. PATENT DOCUMENTS

| | | | |
|---|---|---|---|
| 4,173,683 A | | 11/1979 | Comizzoli .................. 428/447 |
| 4,198,444 A | * | 4/1980 | Yerman ....................... 427/95 |
| 4,250,347 A | | 2/1981 | Fierkens ...................... 174/52 |
| 4,468,411 A | | 8/1984 | Sloan et al. ................... 427/8 |
| 4,506,108 A | | 3/1985 | Kersch et al. ................ 174/52 |
| 4,523,372 A | | 6/1985 | Balda et al. |
| 4,633,573 A | | 1/1987 | Scherer ....................... 29/589 |
| 4,652,465 A | | 3/1987 | Koto .......................... 427/216 |
| 4,661,837 A | | 4/1987 | Sono ........................... 357/84 |
| 4,663,240 A | | 5/1987 | Hajdu et al. ................ 428/545 |
| 4,687,622 A | | 8/1987 | Longden ..................... 376/254 |
| 4,769,344 A | | 9/1988 | Sakai et al. ................. 437/216 |
| 4,833,334 A | | 5/1989 | Valy et al. ................ 250/515.1 |
| 4,835,120 A | | 5/1989 | Mallik et al. ............... 437/209 |
| 4,837,448 A | | 6/1989 | Sainte Luce Banchelin et al. ....... 250/519.1 |
| 4,839,716 A | | 6/1989 | Butt ............................. 357/74 |
| 4,888,449 A | | 12/1989 | Crane et al. ............... 174/52.4 |
| 4,891,687 A | | 1/1990 | Mallik et al. .................. 357/70 |
| 4,935,174 A | | 6/1990 | Suzuki ......................... 264/24 |
| 4,953,002 A | | 8/1990 | Nelson et al. ................. 357/74 |
| 4,967,315 A | | 10/1990 | Schelhorn ................... 361/424 |
| 4,975,762 A | | 12/1990 | Stradley et al. ............. 257/660 |
| 4,979,019 A | | 12/1990 | Paquette et al. ............ 257/690 |
| 5,047,260 A | | 9/1991 | Durand ...................... 427/54.1 |
| 5,096,851 A | | 3/1992 | Yamazaki et al. .......... 437/205 |
| 5,138,430 A | | 8/1992 | Gow, 3rd et al. ............. 357/70 |
| 5,139,969 A | | 8/1992 | Mori .......................... 437/183 |
| 5,149,662 A | | 9/1992 | Eichelberger ................. 437/8 |
| 5,151,770 A | | 9/1992 | Inoue .......................... 357/53 |
| 5,166,772 A | | 11/1992 | Soldner et al. ............. 257/659 |
| 5,180,513 A | | 1/1993 | Durand .................... 252/62.55 |
| 5,202,536 A | | 4/1993 | Buonanno ............. 174/35 GC |
| 5,206,794 A | | 4/1993 | Long .......................... 257/675 |
| 5,239,126 A | | 8/1993 | Oshiba ........................ 174/35 |
| 5,250,845 A | | 10/1993 | Runyan ...................... 257/729 |
| 5,268,331 A | | 12/1993 | Abbott ....................... 437/225 |
| 5,294,826 A | | 3/1994 | Marcantonio et al. ...... 257/659 |
| 5,304,750 A | | 4/1994 | Schubert et al. ............ 181/294 |
| 5,317,107 A | | 5/1994 | Osorio ...................... 174/52.4 |
| 5,384,477 A | | 1/1995 | Bulucea et al. ............. 257/372 |
| 5,406,117 A | | 4/1995 | Dlugoecki et al. .......... 257/659 |
| 5,424,251 A | | 6/1995 | Sono et al. ................. 437/214 |
| 5,441,900 A | | 8/1995 | Bulucea et al. ............... 437/24 |
| 5,527,742 A | | 6/1996 | Weiler et al. ............... 437/211 |
| 5,552,338 A | | 9/1996 | Kang ......................... 437/170 |
| 5,561,265 A | | 10/1996 | Livshits et al. ........ 174/35 GC |
| 5,577,319 A | | 11/1996 | Knecht ........................ 29/827 |
| 5,589,129 A | | 12/1996 | Kato et al. .................. 264/437 |
| 5,610,443 A | | 3/1997 | Inagaki et al. .............. 257/788 |
| 5,629,559 A | * | 5/1997 | Miyahara .................... 257/666 |
| 5,672,918 A | | 9/1997 | Kimbrough et al. ........ 307/126 |
| 5,714,102 A | | 2/1998 | Highum et al. ............. 264/105 |
| 5,770,304 A | | 6/1998 | Nakamura .................. 428/328 |
| 5,780,163 A | | 7/1998 | Camilletti et al. .......... 428/446 |
| 5,824,568 A | | 10/1998 | Zechman .................... 438/112 |
| 5,825,042 A | | 10/1998 | Strobel et al. ........... 250/515.1 |
| 5,834,891 A | | 11/1998 | Novich |
| 5,847,467 A | * | 12/1998 | Wills et al. ................. 257/789 |
| 5,851,852 A | | 12/1998 | Ostop et al. ................ 438/106 |
| 5,864,088 A | | 1/1999 | Sato et al. .................... 174/35 |
| 5,880,403 A | | 3/1999 | Czajkowski et al. ...... 174/35 R |
| 5,888,850 A | | 3/1999 | Havens et al. .............. 438/127 |
| 5,889,316 A | | 3/1999 | Strobel et al. .............. 257/659 |
| 5,946,556 A | * | 8/1999 | Hashizume ................. 438/126 |

* cited by examiner

ELECTRONIC DEVICE PACKAGING

BACKGROUND OF THE INVENTION

The present invention relates to electronic device packaging, and more particularly to hermetic packaging of electronic devices. Even more particularly, the present invention relates to multilayer hermetic coating in electronic device packaging.

Integrated semiconductor circuits are critical devices in most electronic systems today. These integrated semiconductor circuits have been broadly used in a variety of fields. Historically, two versions of many integrated semiconductor circuits were designed by manufacturers, one packaged in a non-hermetic plastic package (plastic encapsulated microelectronics (PEM) device), such as molded epoxy, silicone or phenolic; and another packaged in a hermetic ceramic package. The hermetic ceramic packages were typically used in very sensitive, harsh environment and/or high reliability applications, such as military applications, including weapon systems; space applications, such as for use on Earth space orbit satellites; aerospace applications; ruggedized commercial and medical applications; and transportation applications, such as automotive and avionics applications.

One problem heretofore addressed by hermetic ceramic packages was to prevent the invasion of moisture, ions and other impurities, including oxygen, into critical portions of the package, for example, wire bond sites, and into an integrated semiconductor circuit die. This invasion of impurities can cause oxidation and other erosion of the integrity of the affected structures thereby causing failure of the device. This invasion takes place readily in plastic package devices through cracks or gaps occurring in the molding and in some cases through diffusion through the plastic itself, both of which form paths from an outside environment to the packages contents.

Problematically, in recent years, device manufacturers, for economic reasons, have ceased production of ceramic package devices, thus leaving entities in need of high reliability devices for sensitive applications without a suitable device for their application. Microelectronics are highly susceptible to gases, chemicals and particulates that invade plastic package devices. Pitfalls associated with this sensitivity can include: moisture causing corrosion; chemicals destroying wire bonds, internal circuitry and other pertinent aspects of the device. Further, before a package is added to a device, particulates present in injection molded or otherwise manufactured packages are capable of scratching the surface of the integrated semiconductor circuit die, potentially breaking wire bonds and causing shorts/opens inside the device, and are capable of reacting with or corroding the wire bonds, wires, leads or integrated semiconductor circuit die.

Thus, hermetically sealed packages are required for many applications where contaminants can jeopardize the functional integrity of the device, or where longterm reliability and/or operation in extreme environments are required.

As mentioned above, the current solution to these issues has been to use ceramic package devices. Ceramic packaging technology provides the hermetic sealing and long-term reliability required by many entities. However, the downfall of these packages has been that they are more expensive than similar plastic packages, tend to weigh more, and require specialized manufacturing equipment to produce. Although the ceramic package device does effectively address the issue of hermeticity, the ceramic package device frequently provides a level of reliability and ruggedness that exceeds the levels actually required for most applications.

In contrast, the main advantage of plastic package devices is their ability to be mass-produced more cheaply and more easily than other currently available technologies. However, unlike with ceramic package devices, the largest percentages of failures in plastic package devices can be directly or indirectly related to their inherent lack of hermeticity and to the manufacturing techniques employed. Current users of plastic package devices in high-reliability applications are either incurring higher costs for maintenance of inferior products or suffering from a lack of long-term reliability.

A further advantage of plastic package devices is their abilities to operate at higher frequencies due to the lower dielectric constant of plastic, as compared to ceramic. Also, smaller sizes achievable in plastic package devices enables components to be placed closer together, thereby reducing propagation delays. Further, copper leads in plastic package devices have better electrical and thermal conductivity than KOVAR alloy that is used in the leads of ceramic package devices.

Ceramic package devices perform more consistently at high frequency than plastic package devices because moisture in the plastic can vary, changing the dielectric constant of the package and altering the operating speed of the integrated semiconductor circuit die.

Flexibility in low stress plastic formulations is gained at the expense of increased permeability due to the addition of plasticizers.

An alternative to ceramic package devices employs "wafer-level" coating of the integrated semiconductor circuit die itself, which adds yet more complexity to the manufacturing process, and brings with it engineering challenges as well. The die level application of the coating increases the hermeticity of the integrated semiconductor circuit die as well as the structural reliability of the device at a lower cost and in a manner that can be integrated into current production facilities. Unfortunately, this process must be performed as a fabrication step, before the integrated semiconductor circuit die is cut form the wafer, and thus requires altering "fab" processes. Problematically, once the integrated semiconductor circuit die is cut from the wafer, edges of the integrated semiconductor circuit die remain exposed and susceptible to contaminants. Furthermore, bonding pads on the surface of the integrated semiconductor circuit die must be exposed (for wire bonding for example) and thus create a further point of susceptibility to contamination. And, disadvantageously, this approach does nothing to protect the wires or wire bonds, a common point of contamination-caused failure. U.S. Pat. No. 5,780, 163, issued to Camilletti et al., provides an example of "wafer-level" coating.

Hermetic coatings have also been applied to the integrated semiconductor circuit die and wire bonds after the die is attached to a die attach substrate and the wires are wire bonded to the integrated semi-conductor circuit die and leads. These hermetic coatings use plasma chemical vapor deposition of silicon nitride to prevent moisture from contaminating the device. This process can also be done to deposit diamond-like carbon, silicon oxide and other insulating materials. One example of this type of hermetic coating is shown in U.S. Pat. No. 5,096,851, issued to Yamazaki et al.

Single layer PARYLENE coatings (para-xylylene) have been applied to the integrated semiconductor circuit die and wire bonds prior to packaging for the purpose of allowing for distortion of the wire bonds without short circuiting and reducing the requirements for high tolerances associated with relatively short length wires. U.S. Pat. No. 5,824,568, issued to Zechmans describes single layer PARYLENE coatings.

Bi-layer and tri-layer coating technologies have also been developed to provide moisture and oxygen barriers using any of parylene/BCB (cyclotene®)/SiO2, parylene/A1203, and parylene/SiO2. In these approaches, a PARYLENE layer is first applied, and then one or more subsequent ceramic layers are applied.

SUMMARY OF THE INVENTION

The present invention advantageously provides an approach for hermetic packaging of integrated semiconductor circuits.

The present invention can be characterized in one embodiment as a hermetically coated device comprising an integrated semiconductor circuit die; a first layer comprising an inorganic material, the first layer enveloping the integrated semiconductor circuit die; and a second layer, the second layer enveloping the integrated semiconductor circuit die.

In a further embodiment, the present invention can be characterized as a method of making a hermetically coated device. The method comprises providing an integrated semiconductor circuit die; applying a first layer comprising an inorganic material, the first layer enveloping the integrated semiconductor circuit die; and applying a second layer, the second layer enveloping the integrated semiconductor circuit die.

BRIEF DESCRIPTION OF THE DRAWINGS

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE PREFERRED EMBODIMENTS

The following description of the presently contemplated best mode of practicing the invention is not to be taken in a limiting sense, but is made merely for the purpose of describing the general principles of the invention. The scope of the invention should be determined with reference to the claims.

Figure 1A:
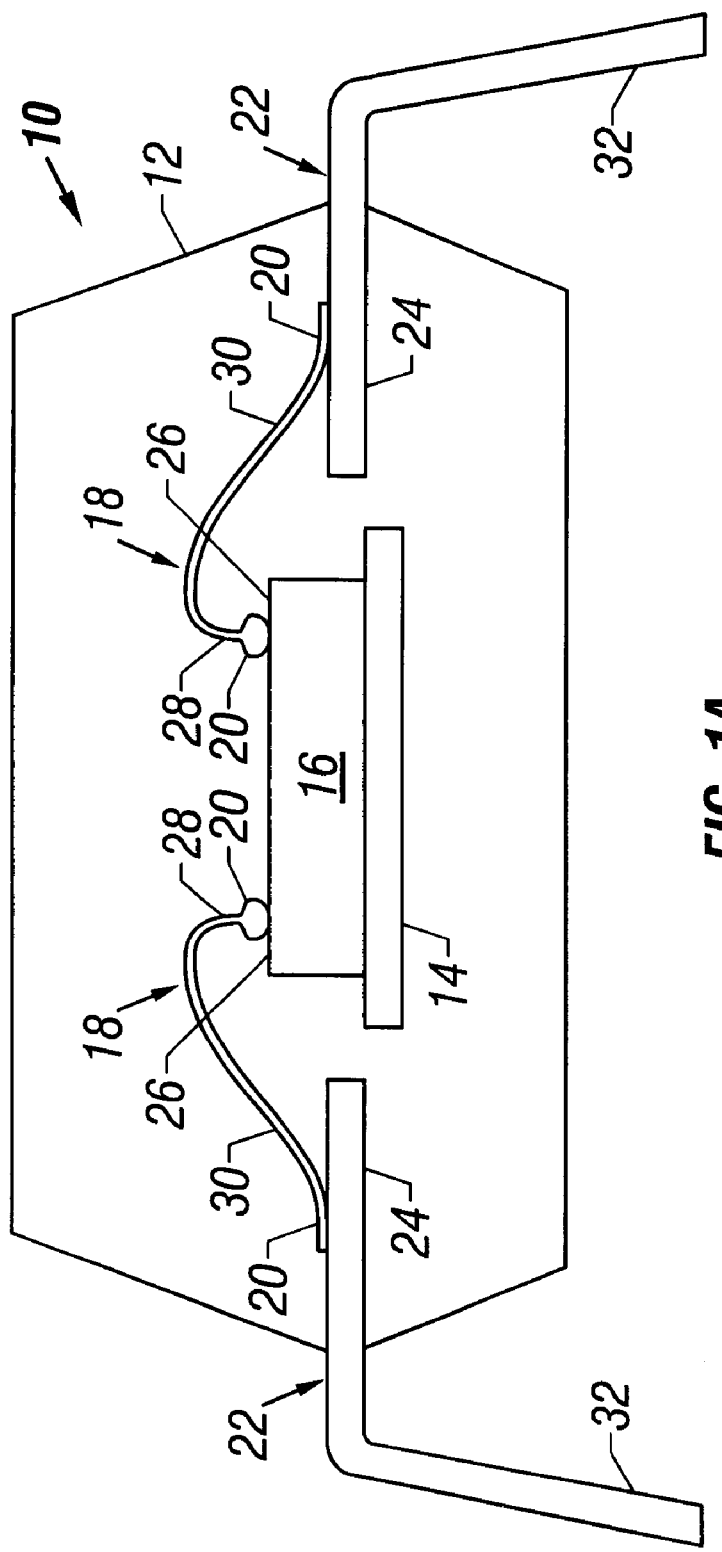
FIG. 1A is a cross-sectional view illustrative of a typical plastic package device, including a plastic package, a die attach substrate, an integrated semiconductor circuit die, wires, wire bonds and leads.

Referring first to FIG. 1A, a cross-sectional view is shown of a plastic package structure 10 (or plastic encapsulated microelectronic (PEM) device), including the plastic package 12, a die attach substrate 14, an integrated semiconductor circuit die 16, wires 18, wire bonds 20 and leads 22. In practice, as is well known in the art, the leads 22 form part of a lead frame prior to assembly of the plastic package structure. The lead frame holds and aligns the leads 22 until the leads are encapsulated at respective interior ends of the leads by the plastic package.

Prior to encapsulation, the die 16 and die attach substrate 14 are positioned near a center of the lead frame, near the interior ends 24 of the leads 22, and wire bonds 20 are formed in a conventional manner, such as by thermocompression, thermosonic ultrasonic bonding, between bond pads 26 on the integrated semiconductor circuit die 16, and the interior ends 24 of the leads 22. These wire bonds 20 are formed by bonding a first end 28 of each of the wires to a respective bond pad 26 on the die 16, and by bonding a second end 30 of each of the wires to a respective one of the interior ends 24 of the leads 22.

Figure 2:
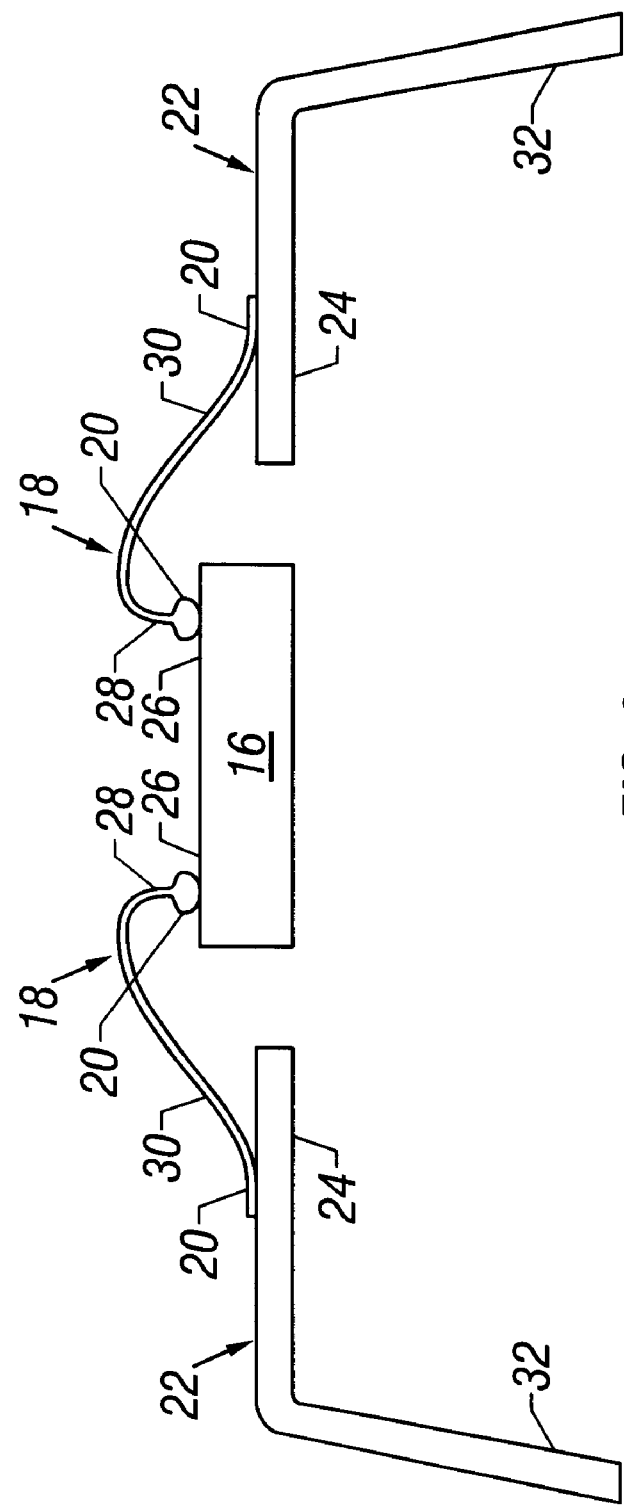
FIG. 2 is a cross-sectional view illustrative of a die/wire/lead structure such as may be assembled prior to application of duplex coatings in accordance with a first embodiment of the present invention.

Once all of the wires 18 are bonded to the respective bond pads 26 and interior ends 24 of the leads 22, the resulting structure (such as is shown in FIG. 2) is encapsulated in the plastic package 12, such as by injection molding. This encapsulation of the resulting structure includes leaving exterior ends 32 of the leads 22 exposed and protruding from the plastic package 12, so that the are available for connection to an electrical system, such as by soldering the exterior ends 32 of the leads 22 to a printed circuit board. During this injection molding process some movement of the free portions of the wires, i.e., middle portions, is typical.

As will be appreciated by the skilled artisan, the above description of the assembly process for a plastic package system, or plastic package integrated circuit device, represents just one plastic package device known in the art, a dual inline pin device. Many other examples, such as flip-chip devices, ball grid array devices, pin grid array devices, bottom chip carrier devices, leaded chip carrier devices, leadless chip carrier devices, quad-flat pack devices, thin quad-flat pack devices, chip carrier J-bend devices, single inline pin devices, DIL-bent-SIL devices, very small peripheral array devices, chip scale packaging devices, and numerous similar devices, all benefit from the advantageous techniques described herein below. Thus, the plastic package integrated semiconductor circuit of FIG. 1A, and the examples described below, should be appreciated as just that, examples.

Problematically, the above-described plastic packaged integrated semiconductor circuit is susceptible to the infusion and moisture and other contaminants, such as oxygen, which can cause the corrosion or oxidation of the wires, the wire bonds, and the integrated semiconductor circuit die. These contaminants enter the plastic package through cracks, such as may form between the plastic package and the exterior ends of the leads where the exterior ends of the leads exit the plastic package; and in some cases may enter by diffusing through the plastic package itself.

Figure 1B:
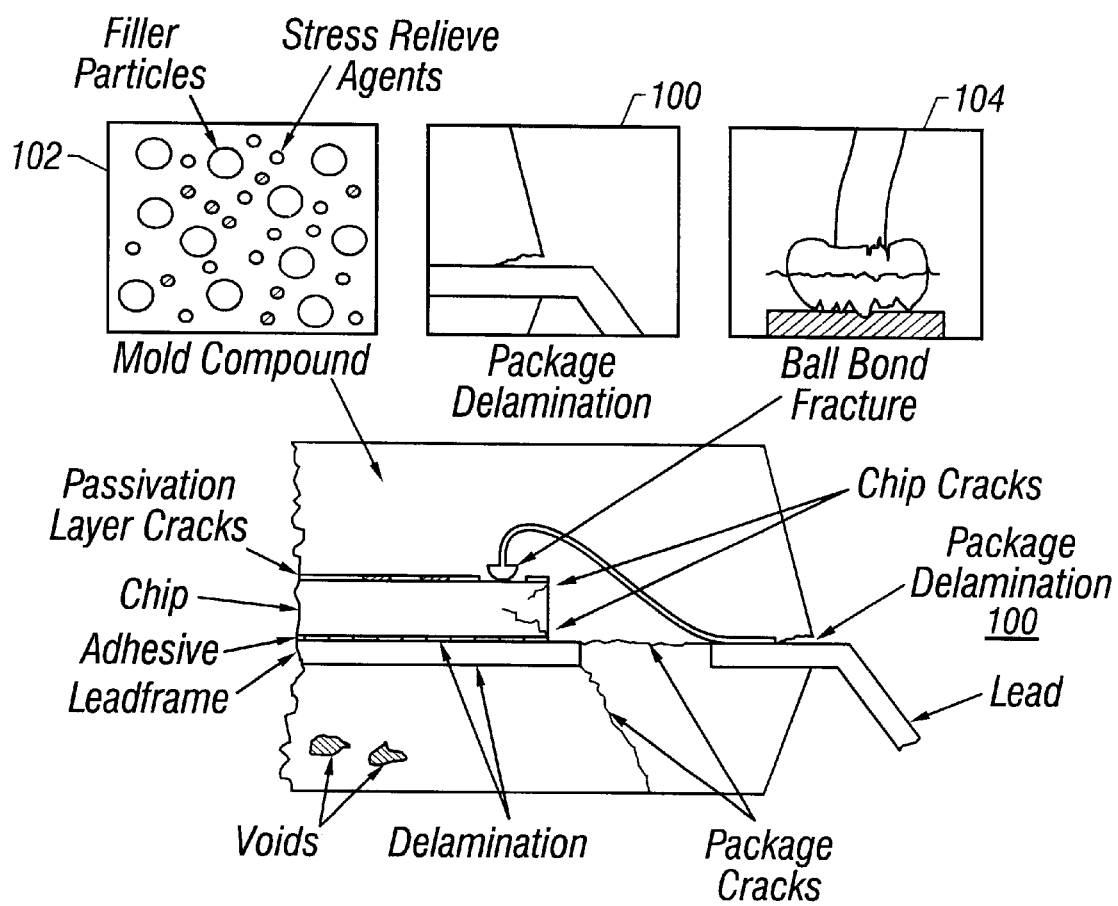
FIG. 1B is a partial cross sectional view of a plastic package device, such as in FIG. 1, showing failure modes that affect such plastic package device due to a lack of hermeticity.

Referring to FIG. 1B, a partial cross section view is shown illustrating various failure modes addressed by the embodiments described herein. These include infiltration of moisture and ions through the plastic package, package delamination 100, chemical contamination from agents in the plastic package 102, ball bond fracture 104, package cracks, and the like.

One of the major paths for moisture ingress in all plastic package devices is where the leads exit the plastic package. The adhesion between the metal and plastic is not good, partly because of release agents added to the resin to ease in the removal of the cured parts from the transfer mold. The narrow gap caused by this metal/plastic separation results in high capillary forces that can draw moisture into the package, along the bond wires and finally to the die. Sealing this gap effectively has proven difficult since flexing the lead, or heating the lead during soldering can break this tenuous seal.

FIGS. 2 through 6 below represent one approach in accordance with the teachings herein for hermetically sealing the integrated semiconductor circuit die, wires, and wire bonds so as to prevent the infusion of contaminants, and thus contamination and ultimately failure of the plastic packaged system.

Referring next to FIG. 2 (and step 600 in FIG. 6), shown is an assembly made up of the die, the wires, the wire bonds and the leads (which, as mentioned above are, at this point, part of a lead frame). This assembly, such as may be used in the plastic package system of FIG. 1 is also one possible starting point for the present embodiments.

As can be seen, the wires are connected electrically between respective bonding pads on an upper surface of the integrated semiconductor circuit die and respective leads of the lead frame.

The bonding of the wires to the bonding pads and to the leads may be achieved in a conventional manner using, for example, thermocompression, thermosonic ultrasonic bonding techniques, as are well known in the art.

Figure 3:
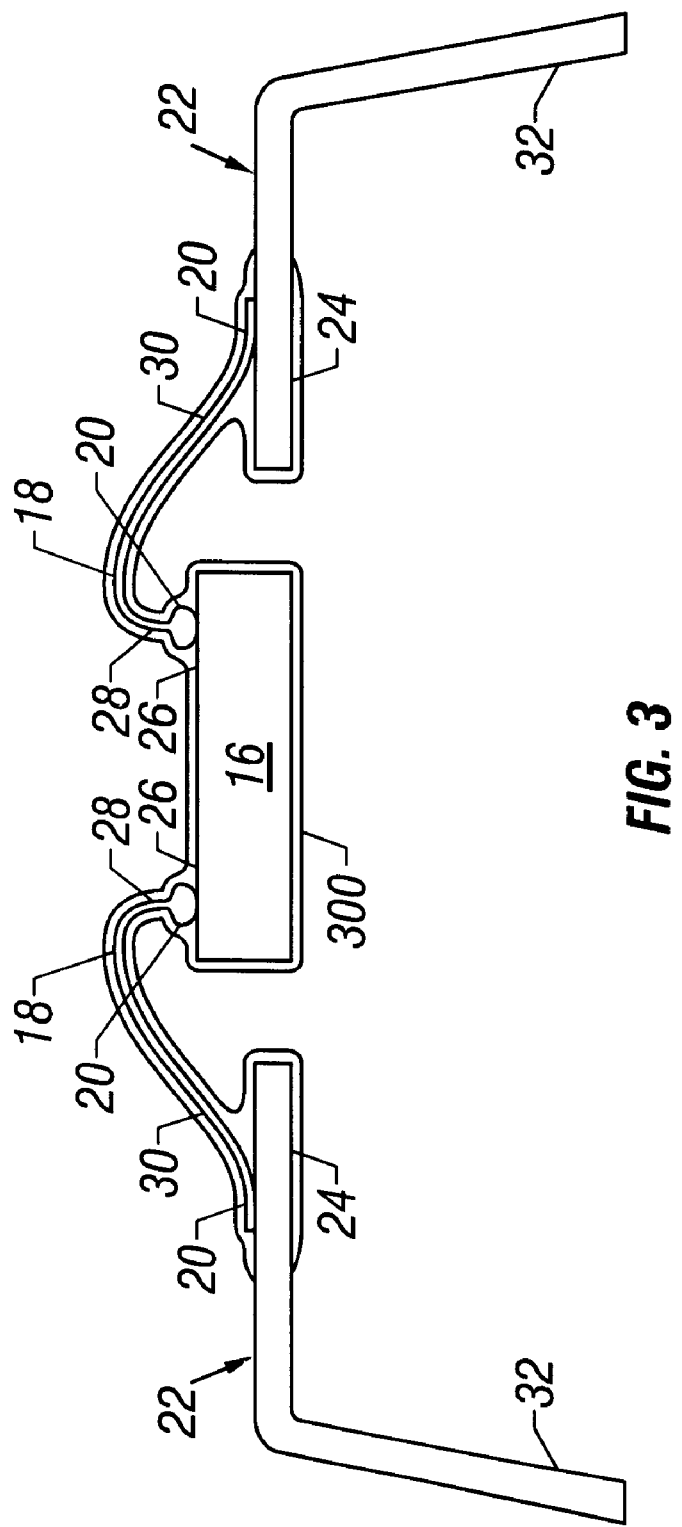
FIG. 3 is a cross-sectional view showing the die/wire/lead structure with an inorganic coating applied thereover.

Referring next to FIG. 3 (and step 600, 602 in FIG. 6), shown is an assembly made up of the integrated semiconductor circuit die 16, the wires 18, the wire bonds 20 and the leads 22. Also shown is a first layer 300 of a duplex coating. The first layer 300 of the duplex coating is a layer of an inorganic ceramic-like material applied so as to encapsulate the integrated semiconductor circuit die 16, the wire bonds 20, the wires 18, and the interior ends 24 of the leads 22.

Encapsulation of the integrated semiconductor circuit die, the wires, the wire bonds and the leads with the first layer of the duplex coating, i.e., the inorganic ceramic like material, is preferably effected by non-line-of-sight processes such as CVD, PECVD, metalorganic chemical vapor deposition and sputtering at temperatures below approximately 300 C. The preferred techniques use a low pressure chamber with the chemicals introduced in a vapor phase, although other approaches are contemplated, such as atmospheric pressure processes.

One process that can be used to encapsulate the integrated semiconductor circuit die (or the plastic package device, or both, as described further hereinbelow) is atomic layer deposition (ALD). This technique achieves an impermeable ceramic coating at low temperatures without the use of plasma, which may damage or destroy the integrated semiconductor circuit die. Corrosion is addressed by using phosphorus and halogen-free precursors. Pinholes, a problem with some other chemical vapor deposition methods, cannot be propagated by this technique. The atomic layer deposition has processing temperatures in the range of 150–250° C. and intrinsic precise layer thickness control at the atomic scale.

Atomic layer deposition (ALD) and atomic layer epitaxial (ALE), and their companion technique metalorganic chemical vapor deposition (MOCVD), are well suited to producing layered structures, either epitaxial or non-epitaxial. Metalorganic chemical vapor deposition can also deposit thicker monolithic layers. A large number of materials can be deposited by these techniques. Dielectrics which may be deposited by atomic layer epitaxial (ALE) in polycrystalline or amorphous form include, for example, aluminum nitride, silicon nitride, silicon carbide, alumina, titania, zirconia, hafnia, silica, magnesia, yttria, ceria, niobium oxide, tantalum oxide, lanthanum oxide, strontium titanate and barium titanate.

Thin-film technology makes it possible to deposit a very thin (down to a few atoms in thickness) layer of material on a substrate or surface. With proper system design, both metalorganic chemical vapor deposition and atomic layer epitaxial modes can be carried out in the same deposition system. The thin films grown by the metalorganic chemical vapor deposition technique are either textured polycrystalline or epitaxial single crystal depending on the substrates used.

Atomic layer epitaxy (ALE) is a special modification of the chemical vapor deposition technique for depositing thin films and related surface structures. The unique feature of atomic layer epitaxial is the self-limiting film growth mechanism which gives it a number of attractive properties, like accurate and simple film thickness control, sharp interfaces, uniformity over large areas, excellent conformality, good reproducibility, multilayer processing capability, and high film qualities at relatively low temperatures. Other than being able to deposit the particular preferred materials for the barrier layer, other aspects of the process justify its selection. Specifically, this process is able to uniformly deposit coatings over large areas with excellent conformity and good reproducibility.

Thickness control is simple and precise since the deposition is 'pulsed' and each pulse deposits the same thickness increment. High quality films can be deposited at low temperatures. There is a downside, in that the deposition rate is low (less than 5000 A/hr) but the quality of the film may be so high that thinner layers are as effective as thick layers from 'cruder' processes. However, since this is a gaseous-based process, large volumes of materials can be uniformly coated at one time, so the throughput in terms of the number of parts coated per hour could be competitive or better than other techniques that are more difficult to scale up.

The metalorganic chemical vapor deposition technique uses liquid metalorganic precursors which vaporize in a carrier gas stream before reaching the substrate surface. The carrier gas can be either oxidizing (air, oxygen) or non-oxidizing such as hydrogen, nitrogen or argon. The formation of the desired compound occurs via the pyrolysis of the metalorganics and the subsequent recombination of the atomic or molecular species at or near the heated substrate. Liquid metalorganic precursors with relatively high vapor pressures are preferred if they are safe, especially if no toxic byproducts are produced. In metalorganic chemical vapor deposition, the deposition rates can be as high as 10 $\mu$m/h. The metalorganic chemical vapor deposition chamber can be optimized to deposit over large areas.

As a further alternative, open-atmosphere combustion chemical vapor deposition (CCVD) technology may be used. Advantages include an order-of-magnitude reduction in operating and capital costs, improved materials quality and performance characteristics, and the ability to tailor-make materials for specific applications (including multi-layered structures). In addition, combustion chemical vapor deposition's relative ease-of-use permits rapid development of new coating/substrate combinations.

The combustion chemical vapor deposition (CCVD) process has demonstrated its potential to address the aforementioned requirements. Combustion chemical vapor deposition technology has significant promise to overcome many of the shortcomings of traditional vapor deposition techniques while yielding equal and/or better quality coatings at a lower cost.

One advantage of the CCVD technology is its ability to deposit thin films in the open atmosphere using inexpensive precursor chemicals in solution. This obviates the need for costly furnaces, vacuum equipment, reaction chambers, and post-deposition treatment (e.g. annealing). As a result, capital requirements and operating costs are reduced at least tenfold when compared to competing vacuum-based technologies (e.g. sputtering and metalorganic chemical vapor deposition). The ability to deposit thin films in the open atmosphere enables continuous, production-line manufacturing. Consequently, throughput potential is far greater than with conventional thin-film technologies, most of which are generally restricted to batch processing.

In practice, precursors are dissolved in a solvent, which typically also acts as the combustible fuel. This solution is atomized to form submicron droplets by means of NANO-MISER technology, owned by MicroCoating Technologies, Inc., of Georgia. The droplets are then convected by an oxygen stream to a flame where they are combusted. A substrate is coated by simply drawing it over the flame plasma. The heat from the flame provides the energy required to evaporate the droplets and for the precursors to react and to deposit on the substrates. Although flame temperatures can be in excess of 800° C., the substrate may dwell in the flame zone only briefly thus remaining cool (<100° C.). Alternatively, the substrate can be actively cooled. Substrate temperature is therefore an independent process parameter that can be varied to actively control the film's microstructure. The process generally takes no more than two hours from set-up to post-deposition cleaning.

Conventional chemical vapor deposition requires precursors with sufficiently high vapor pressures. This frequently necessitates the use of expensive materials and often produces toxic fumes which must be carefully treated ("scrubbed"). In contrast, the combustion chemical vapor deposition technique uses inexpensive, soluble precursors that do not need to have a high vapor pressure. Hence, precursors for the combustion chemical vapor deposition process tend to be between 10 and 100 times less expensive than those used in traditional chemical vapor deposition processes. Physical structure and chemical composition of the deposited films can be tailored to the specific application requirements.

The combustion chemical vapor deposition process is well-suited for high-rate deposition (up to 1 $\mu$m/min.) of dielectrics such as $SiO_2$.

As yet a further alternative, diamond-like carbon (DLC) shows a great deal of promise. It can be deposited to present either a hydrophobic or a hydrophilic surface to the 'outside world'.

The exterior ends of the leads, where electrical contact will subsequently be made, are masked against coating or the coating can be mechanically removed from these areas afterwards.

Masking can be tedious and time consuming and will have to be done correctly since the proposed coating methods are capable of depositing on minute unmasked areas. GORE-TEX, a fluorocarbon foam tape, that conforms by flowing tightly around irregular surfaces (such as rectangular cross section leads on integrated semiconductor circuit die devices) when compressed may be used as a masking material. This material may be too expensive, however, unless it can be sufficiently reusable. Reusable cast rubber molds (commercially available to protect connectors during soldering operations) can provide a more cost effective alternative, as can polyimide tape, tape, organic maskants, metal masks, rubber masks, and plastic masks.

Mechanical or chemical stripping of the coating on the contacts is also an option. A UV laser may provide one mechanism for stripping the coating, by ablating the coating from the leads.

Any ceramic or glassy material is suitable as the first layer of the duplex coating. Preferably the material should be electrically insulating, e.g., greater than $10^8$ ohm-meters; able to be deposited as a conformal film around all the constituent assembled parts of the device; able to be deposited as an essentially pin-hole-free coating, e.g., having a moisture permeability of less than $10^{-10}$ g/cm-sec-torr; able to be deposited at a temperature low enough to avoid detrimental effects to the device and constituents, e.g., at less than 300° C. for 0.1 hours, or equivalent energy input; adherent to the constituent parts of the device so as to resist or prevent delamination or blistering during use of the plastic package device in the presence of moisture, ions and thermal cycling; impervious to moisture, alkali metal ions and halogen ions; non-reactive and otherwise compatible (electrically, physically and mechanically) to the constituent parts of the device and to subsequent processing.

Preferred ceramic materials are oxide ceramics (including alumina, titania and zirconia) silicon-based ceramics (including silicon nitride, silicon oxide and silicon oxynitrides) and diamond-like carbons in amorphous or crystalline forms.

Any thickness able to reliably produce a coherent, essentially pin-hole-free film is satisfactory (typically in excess of 500–1000 Angstroms). Thicker films improve the degree of hermeticity (unless they self-destruct from internal stresses). 5000–10,000 Angstroms is a practical upper limit for economic reasons.

Figure 4:
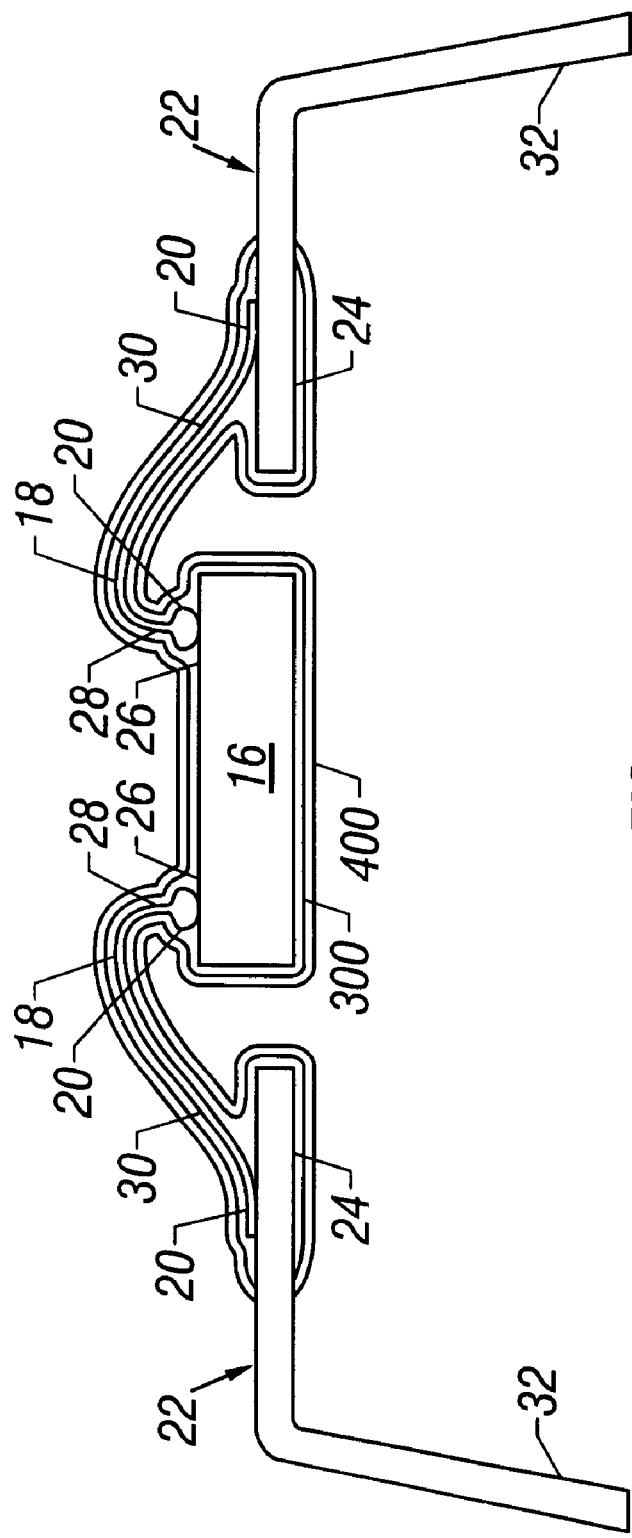
FIG. 4 is a cross-sectional view showing the die/wire/lead structure with the inorganic coating applied over the die/wire/lead structure applied over the inorganic coating.

Referring next to FIG. 4 (and step 604 in FIG. 6), shown is an assembly made up of the integrated semiconductor circuit die 16, the wires 18, the wire bonds 20, the leads 22, and the first layer 300 of the duplex coating. Also shown is a second layer 400 of the duplex coating. The second layer 400 of the duplex coating is a layer of an organic overcoat applied so as to encapsulate the integrated semiconductor circuit die, the wire bonds, the wires, the interior ends of the leads, and the first layer of the duplex coating.

Encapsulation of the integrated semiconductor circuit die, the wires, the wire bonds, the leads and the first layer of the duplex coating with the second layer of the duplex coating, i.e., the organic overcoat is preferably effected by applying a layer of PARYLENE C, a form of para-xylylene.

PARYLENE C has many ideal properties for this part of the duplex coating. Other PARYLENE formulations may also be suitable in various embodiments. The thickness of the coating should preferably be optimized. Thicker coatings will increase the rigidity of the bond wires, be a better cushion against the abrasive and stress effects of the molding compound and provide better physical protection of the ceramic layer. However, thicker coatings are more expensive to apply and will reduce the heat dissipation of the die through the package when applied internally.

As an alternative, a new class of materials offers such an alternative, sol-gel hybrids (or sol-gel derivative materials, or fluoropolymer-silica hybrids), which differ significantly from conventional sol-gels. These materials may be applied thick enough to act as a compliant layer or external scratch resistant layer as an alternative to PARYLENE, since they should have a significantly lower permeability and be harder than PARYLENE. Sol-gel hybrid coatings can also be applied as a hard thin layer, one that may even qualify as a barrier layer, but also as a leveling layer, should one become necessary or desirable before application of the first layer. As a leveling layer, it should be far superior to FOx (flowable oxide) since it can be cured in minutes at 40 to 80° C. in air as opposed to hours at 250–450° C. or higher (in a nitrogen atmosphere) for the FOx coating.

The fluoropolymer-silica hybrids are a new generation of super-adherent coatings having the combined properties of the constituent coating materials: good chemical and excellent water resistance, polymer flexibility, hydrophobicity (water repellency), low surface energy, low dielectric constant and thermal stability (above 200° C.), combined with high transparency, hardness and mechanical strength of the silica network The exterior ends of the leads, where electrical contact will subsequently be made, are masked against coating or the coating can be mechanically removed from these areas afterwards. Masking techniques are described above in reference to the first layer and are substantially the same for the second layer.

Note that while in the figure shown herein the second layer extends beyond the first layer, such layers may not overlap in practice so that masking efficiency can be achieved, i.e., so that the mask does not have to be removed and repositioned between coatings.

The inorganic ceramic-like material of the first layer of the duplex coating serves as a primary barrier layer to moisture and ionic contamination. The organic overcoat of the second layer of the duplex coating also has some barrier properties but it also provides a physical protective layer for the thinner, more brittle inorganic ceramic-like material of the first layer of the duplex coating. Both layers are electrically insulating.

Any organic material is suitable as the organic overcoat of the second layer of the duplex coating. Preferably the material should be electrically insulating, e.g., greater than $10^8$ ohm-m resistivity; able to be deposited as a conformal film around all the constituent assembled parts of the device without damage to the first layer; able to be deposited as an essentially pin-hole-free coating, e.g., less than 0.5 g-mil/100 in$^2$ moisture barrier transmission rate; able to be deposited at a temperature low enough to avoid detrimental effects to the device and constituents; able to be readily built up into thicknesses to at least 0.5 mils, e.g., preferably between 1 and 3 mils; adherent to the first layer so as not to delaminate or bubble in the presence of moisture or ions; compliant and tear resistant, e.g., having an elongation ability of 10% or more; impervious to moisture, alkali metal ions and halogen ions; non-reactive and otherwise compatible (electrically, physically and mechanically) to the constituent parts of the device and to subsequent processing.

The second layer of the duplex layer is applied directly over the top of the first layer and, as mentioned above, is preferably PARYLENE C, other grades of PARYLENE, sol-gel hybrids, or other condensed or plasma polymerized organic films. PARYLENE C is an excellent moisture and ion barrier for an organic material, is an electrical insulator, is pinhole free in sub-micron thick films yet can easily be deposited in layers over 25–75 microns thick. Thick films over 25 microns thick provide rigidity to fragile bond wires during molding and its malleability provides protection from abrasive particles in the molding resin and decouples stresses between components and the molding compound.

While specific examples of materials for the first layer 300 and the second layer 400 are described, it will be appreciated by the skilled artisan that each layer serves a distinct and important purpose. The first layer is a barrier layer and has as its primary function the prevention of moisture and/or ion passage. The second layer is a compliant or protective layer and has as its primary function the protection of the more brittle first layer during handling and manufacture, such as injection molding.

As shown, the duplex coating is preferably applied to partially assembled lead frames containing attached dice and wire bonds, i.e. at the stage just prior to when the parts are transfer molded in standard commercial practices.

Figure 5:
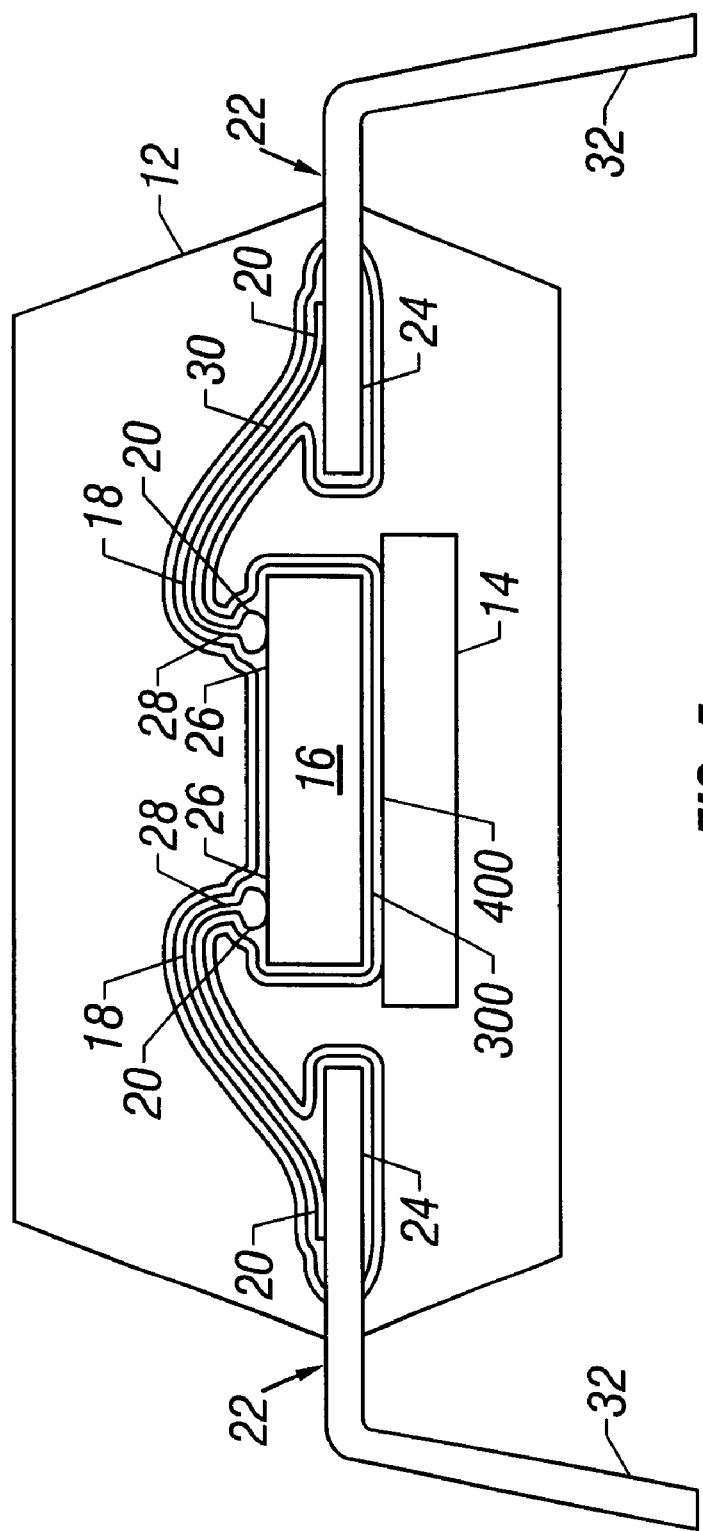
FIG. 5 is a cross-sectional view showing the die/wire/lead structure with duplex coatings, i.e., the inorganic coating with the organic coating thereover, having been enclosed in a plastic package.
Figure 6:
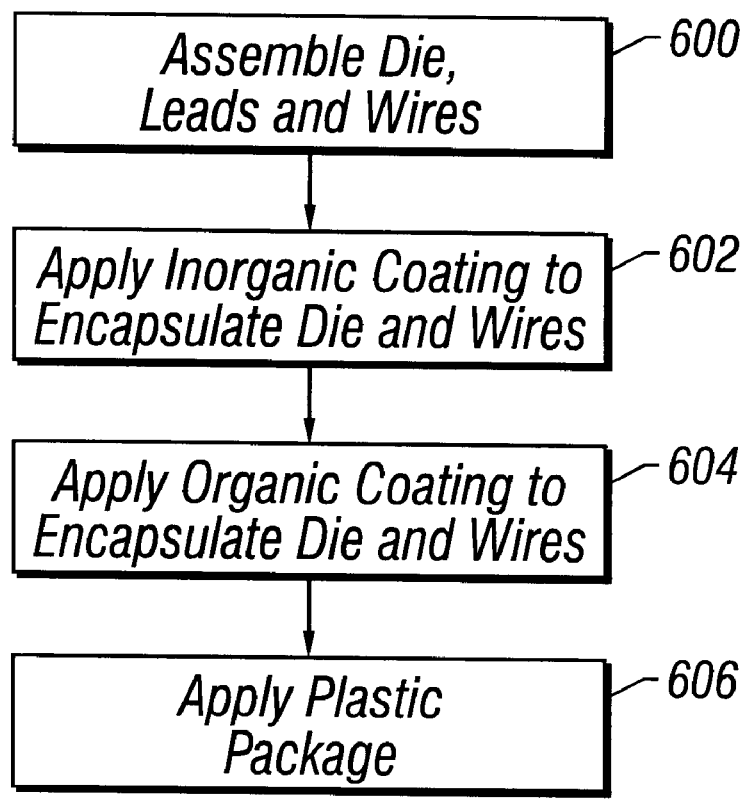
FIG. 6 is a flowchart illustrating the method applied in FIGS. 2 through 5.

Referring next to FIG. 5 (and step 606 in FIG. 6), shown is a completed plastic package device made up of the integrated semiconductor circuit die 16, the wires 18, the wire bonds 20, the leads 22, the first layer 300 of the duplex coating, the second layer 400 of the duplex coating, and a die attach substrate 14. Also shown is a plastic package 12 having been injection molded in a convention manner over the integrated semiconductor circuit die 16, the wires 18, the wire bonds 20, the leads 22, the first layer 300 of the duplex coating, the second layer 400 of the duplex coating, and the die attach substrate 14.

While the plastic package 12 is applied in a conventional manner is it noted that conventional additives, added to protect against moisture and ions may not be needed in plastic packages in accordance with which the present embodiment or other embodiments described herein are employed.

Thus, as can be seen, the duplex coating of the present embodiment provides a hermetic barrier that protects the integrated semiconductor circuit die, the wires, and the wire bonds from contaminants, such as water and oxygen that enter the plastic package. As will be appreciated, the present embodiment, thus provides a plastic packaged, yet hermetic integrated semiconductor circuit device, thereby achieving the economic advantages associated with plastic package devices, while achieving the high-reliability and long-life advantages of ceramic packaged devices.

Further, the embodiments described herein provide much greater packaging flexibility than conventional ceramic packaging designs, while allowing operation in chemically severe environments.

Figure 8:
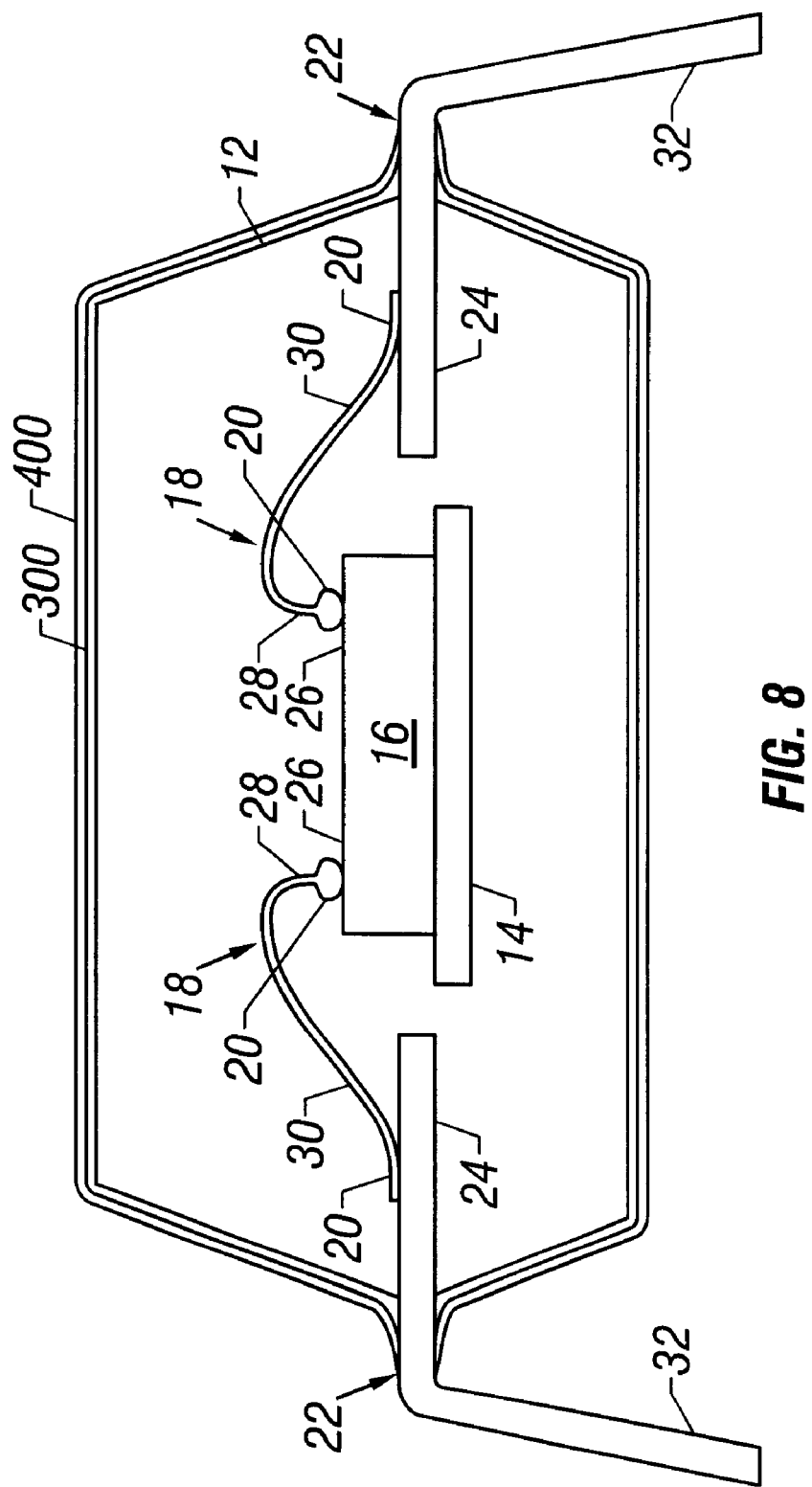
FIG. 8 is a cross-sectional view showing the die/substrate/wire/lead/package structure with the inorganic coating encapsulating the die/substrate/wire/lead/package structure and an organic coating applied over the inorganic coating.

It is noted that while, as shown, the first layer is in contact with the integrated semiconductor circuit die, such contact is not needed. As illustrated below, see FIG. 8, all that is needed is for the first layer to envelope the integrated semiconductor circuit die. And, while FIG. 8 illustrates a plastic package interposed between the first layer and the integrated semiconductor circuit die, it is contemplated that one or more additional layers of coating may be interposed between the first layer and the integrated semiconductor circuit die, with the plastic package also so being interposed, or being outside the first layer as in FIG. 5. Similarly, one or more additional layers, or the plastic package, may be interposed between the first layer and the second layer, with (which is not preferred) or without (which is preferred) the plastic package being so interposed. All that is needed is for the second layer to envelope the first layer. One or more tertiary layers may also envelope the second layer, just as the plastic package envelops the second layer in FIG. 8. Thus, the present embodiment is not limited to just two coating layers, or such that the inorganic first layer and the organic second layer are in contact. Similarly, the first layer need not be in contact with the integrated semiconductor circuit die.

Referring next to FIG. 1 and FIGS. 7 through 9, this same duplex coating, as described above, can also be applied, in another embodiment, over the plastic package of a conventional plastic packed system in order to provide much of the same protection as is provided by application of the duplex coating to bare assembly of the integrated semiconductor circuit die, the wire bonds, the wires, and the lead of the lead frame.

Figure 7:
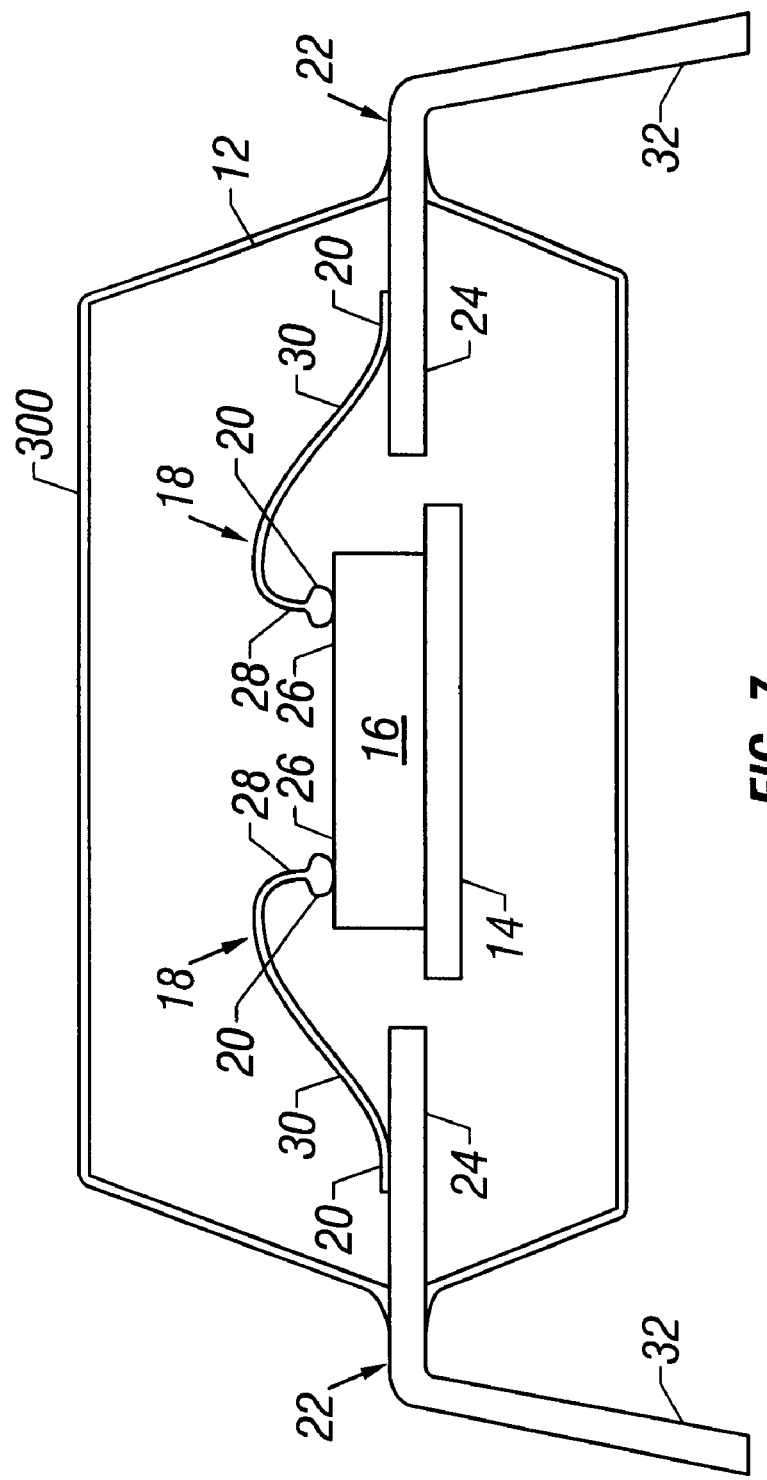
FIG. 7 is a cross-sectional view showing a plastic packaged device, the die attach substrate, including the plastic package, integrated semiconductor circuit die, the wires and the leads within the plastic package, having been encapsulated by an inorganic coating.

Referring to FIG. 7 (and to steps 900, 902, and 904 in FIG. 9), a cross-sectional view is shown of a plastic package structure, such as in FIG. 1, including the plastic package 12, the die attach substrate 14, the integrated semiconductor circuit die 16, the wires 18, the wire-bonds 20 and the leads 22. Also shown is the first layer 300 of the duplex coating. As above, the first layer 300 of the duplex coating is a layer of an inorganic ceramic-like material applied, however, so as to encapsulate the plastic package 12, and the proximal portion of the exterior ends 24 of the leads 22. Application and composition of the first layer 300 of the duplex coating is substantially as described above in reference to FIG. 3, except of course in the present embodiment, the first layer 300 is applied so as to encapsulate the plastic package 12 and its contents, as opposed to just the integrated semiconductor circuit die, wire bonds, wires, and interior ends of the leads.

Thus, first (FIG. 9, Block 900) the assembly comprising the integrated semiconductor circuit die, wire bonds, wires, and leads is formed in a conventional manner as described above. Next, (FIG. 9, Block 902) the assembly, with the exception of the exterior ends of the leads, is encapsulated in the plastic package, as also described above. And then (FIG. 9, Block 904) the first layer of the duplex coating is applied, substantially as described above, but so as to encapsulate the plastic package and its contents, as opposed to just the integrated semiconductor circuit die, wire bonds, wires, and interior ends of the leads. The thickness of the second layer may also be greater in the present embodiment in that more handling of the second coating would be expected than in the prior embodiment.

Referring next to FIG. 8 (and step 906 in FIG. 9), a cross-sectional view is shown of a plastic package structure, such as in FIG. 1, including the plastic package 12, the die attach substrate 14, the integrated semiconductor circuit die 16, the wires 18, the wire-bonds 20 and the leads 22. Also shown is the first layer 300 of the duplex coating as in FIG. 7. And, also shown is the second layer 400 of the duplex coating. As above, the second layer 400 of the duplex coating is a layer of an organic overcoat applied, however, so as to encapsulate the plastic package 12, and the proximal portion of the exterior ends 32 of the leads 22, and the first layer 300 of the duplex coating. Application and composition of the second layer of the duplex coating is substantially as described above in reference to FIG. 4, except of course in the present embodiment, the second layer is applied so as to encapsulate the plastic package and its contents as well as the first layer of the duplex coating, as opposed to just the integrated semiconductor circuit die, wire bonds, wires, interior ends of the leads, and the first layer of the duplex coating.

Figure 10:
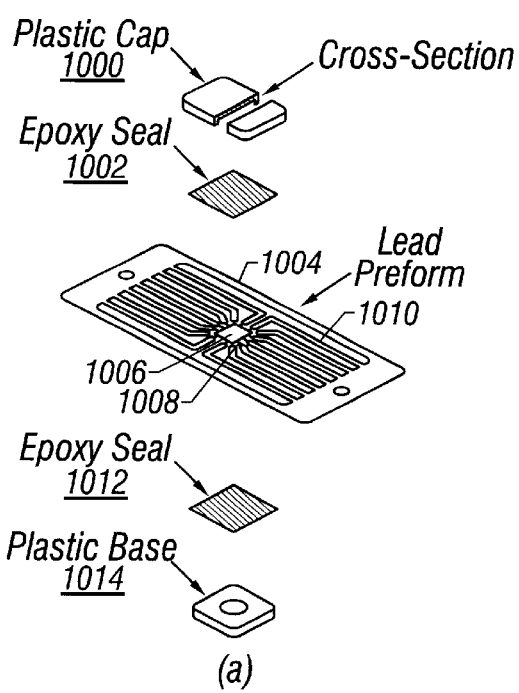
FIG. 10 is a perspective assembly view of one variation of a plastic case that benefits from the embodiments of FIGS. 2 through 8.

Referring next to FIG. 10, shown is an assembly view of a plastic case structure in which the principles described herein may be incorporated. Shown are a plastic cap, a first epoxy seal, a lead frame, an integrated semiconductor circuit die, wires and wire bonds, a second epoxy seal, and a plastic base. In all respects the illustrated assembly is conventional in structure and manufacturing except that prior to assembly, the duplex coating described above is applied to the integrated semiconductor circuit die 1006, the wire bonds 1010, the wires 1008, and interior ends of leads of the lead frame. Masking of or removal of the duplex coating from exterior ends of the leads of the lead frame is effected as described above in order to maintain the exterior ends of the leads for electrical connection.

Figure 11:
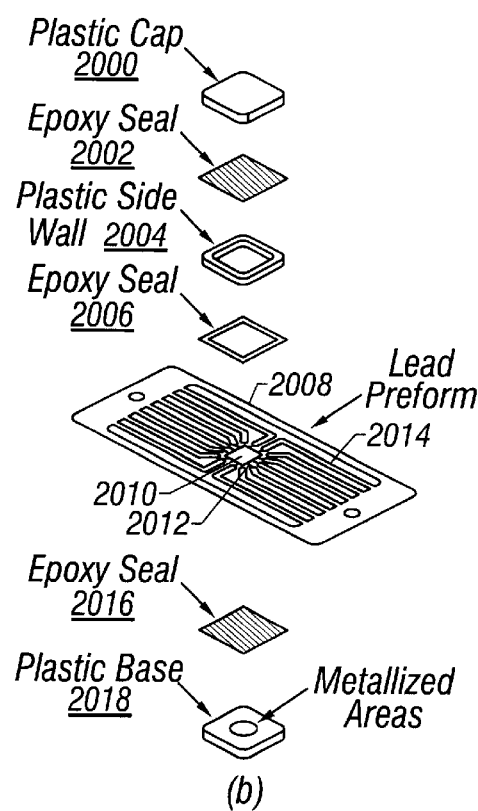
FIG. 11 is a perspective assembly view of another variation of the plastic case of FIG. 10.

Referring next to FIG. 11, shown is an assembly view of another plastic case structure in which the principles described herein may be incorporated. Shown in a plastic cap 2000, a first epoxy seal 2002, a plastic side wall 2004, a second epoxy seal 2006, a lead frame 2008, an integrated semiconductor circuit die 2010, wires 2012 and wire bonds 2014, a third epoxy seal 2016, and a plastic base 2018. In all respects the illustrated assembly is conventional in structure and manufacturing except, as with the embodiment of FIG. 10, prior to assembly, the duplex coating described above is applied to the integrated semiconductor circuit die 2010, the wire bonds 2014, the wires 2012, and interior ends of leads of the lead frame 2008. As in FIG. 10, masking of or removal of the duplex coating from exterior ends of the leads of the lead frame is effected as described above in order to maintain the exterior ends of the leads for electrical connection.

Figure 9:
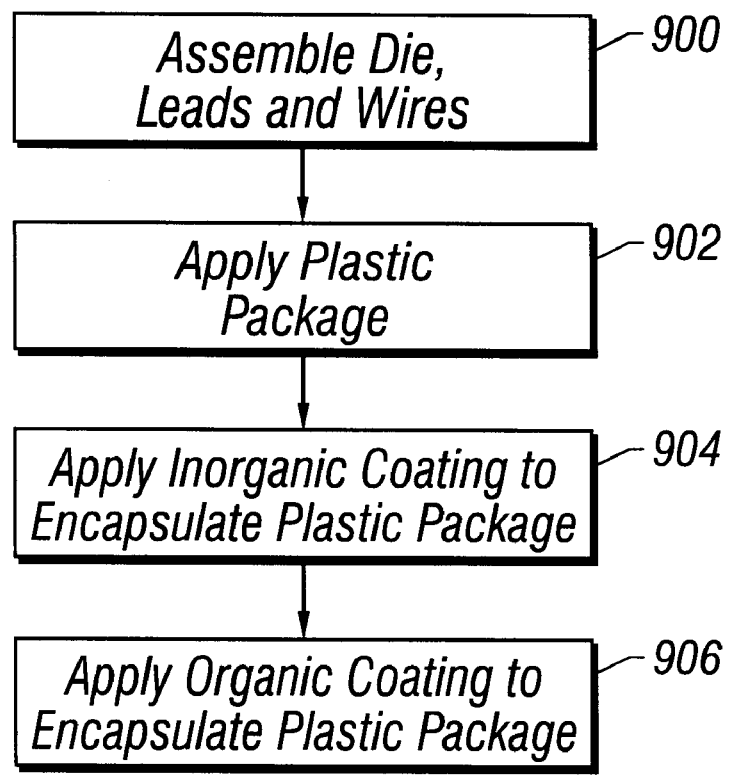
FIG. 9 shows a flowchart outlining the steps applied in FIGS. 7 through 9.
Figure 12:
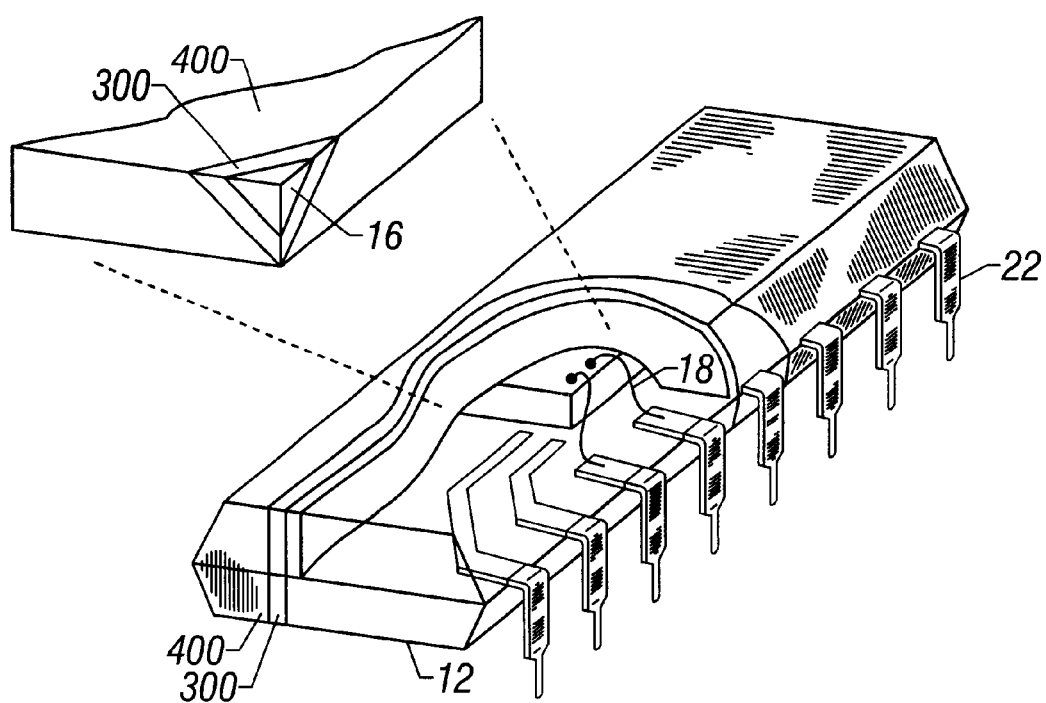
FIG. 12 is a perspective view, partially in cross section, of a variation of a plastic package device showing a die/wire/lead structure with an inorganic coating encapsulating the die/wire/lead structure, with an organic coating applied thereover, such as in FIG. 4, and further showing the die/wire/lead structure packaged within a plastic package, such as in FIG. 5, forming a die/substrate/wire/lead/package structure, the die/substrate/wire/lead/package structure being shown with another inorganic coating encapsulating the die/substrate/wire/lead/package structure and another organic coating applied over the other inorganic coating, such as in FIG. 8.

Referring to FIG. 12, a perspective view is shown, partially in cross section, of a device having both the coating approach of FIGS. 2 through 6 and the coating approach of FIGS. 7 through 9 applied thereto. As the approach of the illustrated embodiment is identical to the individual approaches described in reference to these groups of figures, except that both approaches are applied to the same device, further explanation of these approaches is not made herein.

The skilled artisan will appreciate, however, that for particularly sensitive applications, the illustrated embodiment may provide even greater hermeticity than either of the approaches described above in their numerous variations.

While the invention herein disclosed has been described by means of specific embodiments and applications thereof, numerous modifications and variations could be made thereto by those skilled in the art without departing from the scope of the invention set forth in the claims.

What is claimed is:

1. A hermetically coated device comprising:
   an integrated semiconductor circuit die;
   a first layer comprising an inorganic material, the first layer enveloping the integrated semiconductor circuit die; and
   a second layer, the second layer enveloping the integrated semiconductor circuit die.

2. The hermetically coated device of claim 1 wherein the first layer is in contact with the integrated semiconductor circuit die.

3. The hermetically coated device of claim 1 further comprising:
   a plastic package enveloping the integrated semiconductor circuit die.

4. The hermetically coated device of claim 3 wherein the plastic package is in contact with the second layer.

5. The hermetically coated device of claim 3 wherein said plastic package comprises a plastic cap.

6. The hermetically coated device of claim 1 further comprising:
   a lead, the lead having an interior end and an exterior end;
   a wire;
   a bonding pad on a surface of the integrated semiconductor circuit die;
   a first wire bond between a first end of the wire and the bonding pad; and
   a second wire bond between a second end of the wire and the interior end of the lead;
   wherein the wire, the bonding pad, the first wire bond and the second wire bond are in contact with and enveloped by the first layer.

7. The hermetically coated device of claim 1 further comprising:
   a plastic package enveloping the integrated semiconductor circuit die;
   wherein the first layer envelops the plastic package.

8. The hermetically coated device of claim 1 wherein the first layer comprises a material selected from the group of inorganic materials consisting of metal oxides, silicon nitride, silicon carbide aluminum nitride, or diamond-like carbons.

9. The hermetically coated device of claim 1 wherein the second layer comprises a material selected from the group of organic materials consisting of para-xylyene, hybrid solgel, polymeric materials.

10. A method of making a hermetically coated device comprising:
    providing an integrated semiconductor circuit die;
    applying a first layer comprising an inorganic material, the first layer enveloping the integrated semiconductor circuit die; and
    applying a second layer, the second layer enveloping the integrated semiconductor circuit die.

11. The method of claim 10 wherein applying of the first layer comprising contacting the integrated semiconductor circuit die with the first layer.

12. The method of claim 10 further comprising:
    enveloping the integrated semiconductor circuit die within a plastic package.

13. The method of claim 12 wherein the enveloping within the plastic package comprises contacting the second layer with the plastic package.

14. The method of claim 12 wherein said enveloping within the plastic package comprises placing a plastic cap over the integrated semiconductor circuit die.

15. The method hermetically coated device of claim 10 further comprising:
    forming a first wire bond between a first end of a wire and a bonding pad on a surface of the integrated semiconductor circuit die; and
    forming a second wire bond between a second end of the wire and the interior end of the lead;
    wherein the applying of the integrated semiconductor circuit die within the first layer comprises applying the first layer to the wire, the bonding pad, the first wire bond and the second wire bond.

16. The method of claim 10 further comprising:
    enveloping the enveloping the integrated semiconductor circuit die within a plastic package;
    wherein the applying of the first layer includes enveloping the plastic package with the first layer.

* * * * *

UNITED STATES PATENT AND TRADEMARK OFFICE
CERTIFICATE OF CORRECTION

PATENT NO. : 6,368,899 B1
DATED : April 9, 2002
INVENTOR(S) : Featherby et al.

It is certified that error appears in the above-identified patent and that said Letters Patent is hereby corrected as shown below:

<u>Column 14,</u>
Line 42, delete "enveloping the" (second occurrence)

Signed and Sealed this

Thirteenth Day of August, 2002

*Attest:*

*Attesting Officer*

JAMES E. ROGAN
*Director of the United States Patent and Trademark Office*